(12) United States Patent
Liau

(10) Patent No.: US 6,993,735 B2
(45) Date of Patent: Jan. 31, 2006

(54) METHOD OF GENERATING A TEST PATTERN FOR SIMULATING AND/OR TESTING THE LAYOUT OF AN INTEGRATED CIRCUIT

(75) Inventor: Eric Liau, München (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 10/623,067

(22) Filed: Jul. 18, 2003

(65) Prior Publication Data

US 2004/0034838 A1 Feb. 19, 2004

(30) Foreign Application Priority Data

Jul. 19, 2002 (EP) .......................................... 02090271

(51) Int. Cl.
G06F 17/50 (2006.01)

(52) U.S. Cl. ................................. 716/4; 716/5; 714/39
(58) Field of Classification Search ................. 716/1–6, 716/16–18; 714/39, 738–742
See application file for complete search history.

(56) References Cited

U.S. PATENT DOCUMENTS

| | | | |
|---|---|---|---|
| 6,311,318 B1 * | 10/2001 | Souef et al. ................... | 716/18 |
| 6,543,020 B2 * | 4/2003 | Rajski et al. ................ | 714/738 |
| 6,782,515 B2 * | 8/2004 | Scott et al. ..................... | 716/4 |
| 2002/0032898 A1 * | 3/2002 | Souef et al. ................... | 716/18 |
| 2002/0073374 A1 * | 6/2002 | Danialy et al. ............. | 714/738 |
| 2003/0188246 A1 * | 10/2003 | Rearick et al. ............. | 714/738 |

OTHER PUBLICATIONS

Rudnick, E. M. et al.: "Automatic Test Generation", "Genetic Algorithms for VLSI Design, Layout and Test Automation", Prentice Hall, Upper Saddle River, NY, 1999, pp. 159–166 and pp. 179–184.

Hsiao, M. S. et al.: "Sequential Circuit Test Generation Using Dynamic State Traversal", European Design and Test Conference, Mar. 1997, pp. 22–28.

Singer, S. et al.: "Virtual Test Automation Generator (VTAG)", Navair Lakehurst, May 5, 2000, pp. 1–10.

* cited by examiner

Primary Examiner—Stacy A. Whitmore
Assistant Examiner—Binh Tat
(74) Attorney, Agent, or Firm—Laurence A. Greenberg; Werner H. Stemer; Ralph E. Locher

(57) ABSTRACT

A method of generating a test pattern for simulating and/or testing the layout of an integrated circuit includes the steps of generating a set of test patterns on a random basis, applying the set of test patterns to the integrated circuit using an automatic test equipment, determining the outputs of the integrated circuit, processing the outputs to determine whether predetermined test criteria are met, and, depending on a result of the processing step, generating a new set of test patterns based on the old set of test patterns by using a genetic algorithm. Accordingly, the method employs a genetic algorithm to optimize a set of random patterns based on measurements by using an automatic test equipment. Thereby, a set of worst case noise patterns can be selected automatically.

26 Claims, 3 Drawing Sheets

METHOD OF GENERATING A TEST PATTERN FOR SIMULATING AND/OR TESTING THE LAYOUT OF AN INTEGRATED CIRCUIT

BACKGROUND OF THE INVENTION

Field of the Invention

To achieve high performance and high integration density, the dimensions of integrated circuit components are scaled down more and more. In particular, transistor dimensions are scaled down while lower power dissipation is achieved by scaling down the supply voltage. However, due to high packing density of transistors, the power supply current is increasing, and hence, large current swings within a short period of time can cause considerable noise. As a consequence, one difficulty circuit designers face is the power delivery of very high performance circuits due to the severe switching noise.

In order to verify the function of a newly designed integrated circuit, the circuit is first simulated and then tested. During simulation, multiple input signals are applied to the inputs of the circuit, and the output signals of the circuit calculated. The input signals are referred to as test patterns. If the output signals do not sufficiently approximate preset target signals, the circuit is redesigned and resimulated.

Subsequently, when simulation is completed, a chip containing the integrated circuit is manufactured and tested using ATE (Automatic Test Equipment). The ATE also applies a test pattern to the circuit. The test pattern for the ATE has to be input manually by a user. Generally, the same test pattern that has been used for simulation is also used for testing. If the output signals generated by the circuit in response to the test pattern of the ATE deviate from preset target signals, the circuit is redesigned, resimulated and retested.

As the complexity of integrated circuits increases, integration density and functionality increases dramatically. The simultaneous switching of a large number of transistors induces a large current spike. The switching noise on the power distribution network must be suppressed to a tolerable level to ensure the reliability of the circuit. In order to efficiently combat the switching noise, estimation of the worst case switching noise is required.

On way of determining the worst case switching noise is to simulate all combinations of input patterns to determine which combination will induce the maximum switching noise. However, the complexity of the solution space is exponentially proportional to the number of primary inputs of the system. Accordingly, it would require an enormous time to process the entire solution space for even a moderately complex system.

To this end, a number of approaches have been proposed to deal with these problems. In "Estimation of Switching Noise on Power Supply Lines in Deep Sub-micron CMOS circuits", Shiyou Zhao and Kaushik Roy, $13^{th}$ International Conference on VLSI Design, IEEE January 2000, there is proposed a probabalistic approach to determine the lower bound of the worst case switching noise on power supply lines. The algorithm described therein traces the worst case input patterns which induces the steepest maximum switching current spike and therefore the maximum switching noise. This is based on the observation that the maximum switching noise is directly related to the steepest maximum switching current spike.

In this approach, the design of an integrated circuit is simulated by applying randomly generated input signal vectors to the inputs of the circuit. For each input vector pair, the simulated peak switching current is determined. The worst case input vector pairs feed, as initial population, a genetic algorithm. The genetic algorithm is designed to single out the near optimal input pattern(s) that induce the steepest maximum switching current spike and, therefore, the worst case switching noise. The worst case input patterns are then used in HSPICE (simulation program with integrated circuit emphasis) simulation of the circuits to extract the exact current waveform.

One problem associated with this approach is the difficulty of generating suitable random test patterns. The larger the number of random test patterns, the higher the likelihood of generating a test pattern which approximates the worst case sufficiently. However, since the simulation of each test pattern is time consuming, the simulation of a large number number of test patterns is not practical.

In particular, if a genetic algorithm is used, it is too time consuming to simulate every single random pattern out of every new pattern population before the algorithm is able to determine which of the patterns of the population is to be selected for further optimization. Therefore, this method becomes saturated by the number of trial random patterns in each pattern population. It is suitable for small circuits. However, it could take up to years to perform a full chip simulation of a large circuit using even the fastest simulation applications.

SUMMARY OF THE INVENTION

It is accordingly an object of the invention to provide a method of generating a set of test patterns and/or a set of input signals for simulating and/or testing a layout of an integrated circuit, a corresponding data processing configuration, and a computer-readable medium having computer-executable instructions for performing a method of generating a set of test patterns and/or a set of input signals for simulating and/or testing a layout of an integrated circuit which overcome the above-mentioned disadvantages of the heretofore-known methods and devices of this general type.

With the foregoing and other objects in view there is provided, in accordance with the invention, a method of generating a set of test patterns for the simulation and/or test of the layout of an integrated circuit, the method includes the steps of:

(a) generating a set of test patterns on a random basis;

(b) applying the set of test patterns to the integrated circuit using automatic test equipment (ATE);

(c) determining the outputs of the integrated circuit;

(d) processing the outputs to determine whether given test criteria are met;

(e) depending on the determination in step (d), generating a new set of test patterns on the basis of the set of test patterns generated in step (a) using a genetic algorithm.

Accordingly, the method employs a genetic algorithm (optimization method) to optimize a set of random patterns based on measurements using an ATE. Thereby, a set of worst case noise patterns can be selected automatically.

The selected set of worst case noise patterns can be used to re-simulate the layout of the integrated circuit for detail design analysis or improvement.

This approach is more efficient and faster than any pure random-based method employing a non-optimal random pattern generation or simulation approach. In addition, it can be used with any ATE system.

A genetic algorithm can be equally employed to detect a set of potential worst case test conditions in respect of input signals supplied to an integrated circuit (e.g. power supply). The parameters of such input signals are referred to as AC/DC parameters.

A further mode of the invention includes repeating steps (b) to (e) until the given test criteria are met.

Another mode of the invention includes: (f) repeating steps (b) to (e) for a given number of times or until the given test criteria are met.

A further mode of the invention includes the steps of generating a new set of test patterns on a random basis, if the given test criteria are not met after repeating steps (b) to (e) the given number of times; and repeating step (f) based on the new set of test patterns.

A further mode of the invention includes concluding that the given test criteria are met if the set of test patterns is associated with an average fitness above a given value.

Yet a further mode of the invention includes combining at least some of the test patterns according to the genetic algorithm in order to generate the new set of test patterns.

Another mode of the invention includes the steps of selecting test patterns from the set of test patterns according to given selection criteria in order to provide selected test patterns, and combining the selected test patterns according to the genetic algorithm in order to generate the new set of test patterns.

A further mode of the invention includes the step selecting a test pattern if the test pattern is associated with a fitness value greater than a reference value.

Another mode of the invention includes: (g) selecting a test pattern if the test pattern is associated with a highest fitness value of all unselected test patterns.

A further mode of the invention includes repeating step (g) until a given percentage of test patterns has been selected.

Another mode of the invention includes the steps of: (h) sorting the selected test patterns according to an order of associated fitness values, (i) randomly selecting parent test patterns from test patterns as sorted in step (h) in order to provide selected parent test patterns, and (j) combining the selected parent test patterns.

According to a further mode of the invention, the genetic algorithm includes a crossing over, re-combination, and/or mutation of selected test patterns.

Another mode of the invention includes generating a plurality of sets of test patterns, each set of test patterns being included in a test pattern population.

Another mode of the invention includes performing steps (a) to (e) for each respective test pattern population.

With the objects of the invention in view there is also provided, a method of generating a set of input signals for the simulation and/or test of the layout of an integrated circuit, the method including the steps of:

(m) generating a plurality of sets of input signals;

(n) applying the plurality of sets of input signals to the integrated circuit using automatic test equipment (ATE);

(o) determining the outputs of the integrated circuit;

(p) processing the outputs to determine whether given test criteria are met; and (q) depending on the determination in step (p), generating a new plurality of sets of input signals on the basis of the plurality of sets of input signals generated in step (m) using a genetic algorithm.

According to this method, a set of worst case test conditions due to resulting high power supply noise (dynamic current) can be detected without having to manually and/or randomly select parameters of input signals.

This method may also be implemented using existing ATE systems.

The input signals obtained as a result of this method may subsequently be re-simulated.

Preferably, the method of approximating a worst case set of test pattern is performed together with the method of approximating a set of worst case input signals parameters. This way, an overall worst case condition of operation of the integrated circuit can be approximated.

Another mode of the invention includes generating the plurality of sets of input signals such that at least some of the input signals are associated with a number of AC/DC parameters.

Another mode of the invention includes providing respective given parameters of each respective one of the sets of input signals such that given parameters of each one of the sets of input signals varies from given parameters of each other one of the sets of input signals.

Another mode of the invention includes repeating steps (n) to (q) until the given test criteria are met.

Another mode of the invention includes: (r) repeating steps (n) to (q) a given number of times or until the given test criteria are met.

A further mode of the invention includes concluding that the given test criteria are met if the plurality of sets of input signals is associated with a worst case of operation situation.

According to another mode of the invention, step (q) includes combining at least some of corresponding ones of the input signals of different sets of input signals according to the genetic algorithm in order to generate a new set of input signals.

With the objects of the invention in view there is also provided, a method of generating test patterns and input signals for simulating and/or testing a layout of an integrated circuit, the method includes the steps of:

generating a set of test patterns on a random basis, applying the set of test patterns to an integrated circuit by using an automatic test equipment and processing outputs of the integrated circuit in order to determine whether given test criteria are met, and, depending on a determination result, generating a new set of test patterns based on the set of test patterns by using a genetic algorithm; and generating a plurality of sets of input signals, applying the plurality of sets of input signals to the integrated circuit by using the automatic test equipment and processing outputs of the integrated circuit in order to determine whether given test criteria are met, and, depending on a determination result, generating a new plurality of sets of input signals based on the plurality of sets of input signals by using a genetic algorithm.

With the objects of the invention in view there is also provided, a data processing configuration, including:

an automatic test equipment; and a data processing system operatively connected to the automatic test equipment, the data processing system being programmed to generate a set of test patterns on a random basis, apply the set of test patterns to an integrated circuit by using the automatic test equipment, determine outputs of the integrated circuit, process the outputs in order to determine whether given test criteria are met, and depending on a determination result, generate a new set of test patterns based on the set of test patterns by using a genetic algorithm.

With the objects of the invention in view there is further provided, a data processing configuration, including:
an automatic test equipment; and
a data processing system operatively connected to the automatic test equipment, the data processing system being programmed to generate a plurality of sets of input signals, apply the plurality of sets of input signals to an integrated circuit by using the automatic test equipment, determine outputs of the integrated circuit, process the outputs in order to determine whether given test criteria are met, and depending on a determination result, generate a new plurality of sets of input signals based on the plurality of sets of input signals by using a genetic algorithm.

With the objects of the invention in view there is also provided, a computer-readable medium having computer-executable instructions for performing a method of generating a set of test patterns for simulating or testing of a layout of an integrated circuit, the method including the steps of (a) generating a set of test patterns on a random basis; (b) applying the set of test patterns to an integrated circuit by using an automatic test equipment; (c) determining outputs of the integrated circuit; (d) processing the outputs in order to determine whether given test criteria are met; and (e) depending on a determination result in step (d), generating a new set of test patterns based on the set of test patterns generated in step (a) by using a genetic algorithm.

With the objects of the invention in view there is also provided, a computer-readable medium having computer-executable instructions for performing a method of generating a set of input signals for simulating or testing a layout of an integrated circuit, the method including the steps of (m) generating a plurality of sets of input signals; (n) applying the plurality of sets of input signals to an integrated circuit by using an automatic test equipment; (o) determining outputs of the integrated circuit; (p) processing the outputs in order to determine whether given test criteria are met; and (q) depending on a determination result in step (p), generating a new plurality of sets of input signals based on the plurality of sets of input signals generated in step (m) by using a genetic algorithm.

Other features which are considered as characteristic for the invention are set forth in the appended claims.

Although the invention is illustrated and described herein as embodied in a method of generating a test pattern for the simulation and/or test of the layout of an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Genetic algorithms are based on the principles of natural selection. In particular, genetic algorithms are stochastic search methods which simulate natural biological evolution. The algorithms operate on the basis of a population of potential solutions and, applying the principle of "survival of the fittest" to these potential solutions, produce a better approximation of a target solution in each iteration of the algorithm.

Each iteration of the algorithm produces a new generation of approximations. The approximations of each generations are created by the process of selecting individuals according to their level of "fitness" in the problem domain. The selected individuals are bred with one another using operators borrowed from natural genetics. This process leads to the evolution of populations of individuals that are better suited for their environment than the individuals from which they were created, just as in natural adaptation.

Accordingly, genetic algorithms model natural processes such as selection, cross over, recombination and mutation.

Figure 1:
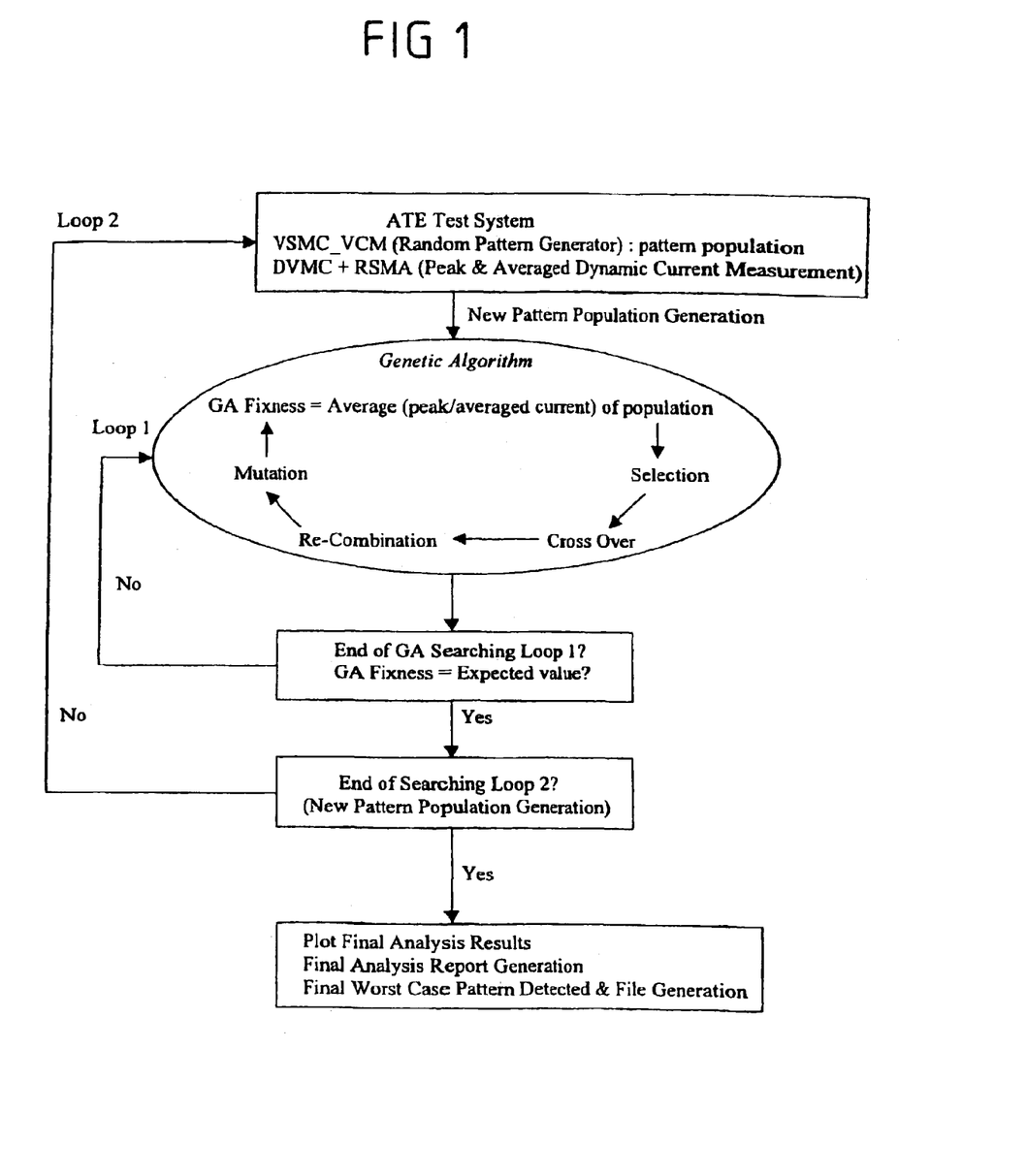
FIG. 1 is a flow chart illustrating a method according to an embodiment of the invention.

FIG. 1 shows a method for detecting the worst case current consumption/peak current pattern (RSMA) based on a genetic algorithm. This method operates on the basis of populations of individual patterns instead of a single pattern solution. In this way, the search for better approximations can be performed in a parallel manner. Therefore, this method is more efficient than single pattern searching processes using dynamic random algorithm methods.

Genetic algorithms may be employed for the simulation of an integrated circuit design in order to solve the worst case pattern search problem. The efficiency of genetic searching procedures is largely dependent on the number of pattern populations and the number of test patterns in each pattern population. However, as indicated above, the simulation-based approach forms a limitation if genetic algorithms are to be employed. The genetic selection procedure has to evaluate every "fitness" (dynamic peak/averaged current)of the test patterns in each pattern population. For example, there may be 200 pattern populations each including 20 patterns. Thus, the genetic algorithm has to evaluate the fitness of 200*20=4,000 patterns. If each test pattern is a 50 cycles test pattern which requires 30 minutes of simulation time (e.g. EPIC oder SPICE simulator), then the total required searching and simulation time is 4000*30 minutes=120,000 minutes, i.e. approximately 83 days of non stop simulation in order to process 200 pattern populations only.

In addition, the full pattern combination domain increases proportionally to the complexity of VLSI (Very Large-Scale Integration) or ULSI (Ultra Large Scale Integration) designs. Therefore, a subset of 200 pattern populations is only a very small subset of the full pattern combination domain.

In contrast, when using a genetic algorithm together with ATE, many more pattern populations per time unit can be processed. This is because the testing of an integrated circuit using ATE is considerably faster than simulation using conventional systems. Accordingly, the approximation of worst case test patterns in a given period of time is much more accurate.

An implementation of a dynamic genetic algorithm for use with ATE is presented in the following. At the beginning of the computation, a number of individual random patterns $$P_N^{POP} = (p_1, p_2, \ldots, p_N) \qquad (1)$$

are randomly generated and initialized, wherein N is the maximum number of random patterns and POP is the maximum number of pattern populations.

Subsequently, for each individual pattern $(p_1, p_2, \ldots, P_N)$, the objective functions $$I_{peak}(\forall I_{sample}(P_N, \text{SRMS})) \qquad (2)$$

and $$I_{averaged}(P_N, \text{SRMS}) \qquad (3)$$

are evaluated using equation (4):

$$I_{Measurement}(P_N, T) = \frac{V_{DD}(P_N, T)}{R_{eff}} + \qquad (4)$$

$$\frac{1}{L_{eff}} \int_{T_{min}}^{T_{max}} V_{DD}(P_N, T)dT + \Delta I_{CMOS}(P_N, T), \forall T, P_N > 0$$

$$T = \text{SRMS}(T_{min}, T_{max}) \Rightarrow$$

-continued
$$\text{Random\_Float\_Number}(T_{min}, T_{max})T_{max} \geq T_{min},$$

$$\forall T_{min}, T_{max} > 0, I_{Measurement}(P_N, T) \in \{I_{peak}, I_{averaged}\}$$

The first (initial) generation is thus produced, and the averaged fitness of the individual patterns $(p_1, p_2, \ldots, p_N)$ is calculated using equation (5):

$$\text{Averaged\_Fixness}(\text{Fixness } (P_N^{POP})) = \frac{\sum_{N=0}^{N} I_{Measurement}(P_N)}{N}, N, \qquad (5)$$

$$P_N > 0 \text{ Fixness } (P_N) = I_{Measurement}(P_N, T) \in \{I_{peak}, I_{averaged}\}$$

If the optimization criteria $$(\text{Averaged\_Fitness}(I_{Measurement}(P_N^{POP})) < I_{MAX\_REF}) \qquad (6)$$

is not met for any existing population, a new population is created on the basis of the existing population. Individual patterns are selected according to their fitness for the production of offspring (loop 1 in FIG. 1).

In this selection approach, the basic concept of tournament selection is employed. That is, only the best individual pattern from the existing population is selected as a parent.

This process is repeated until a pre-defined percentage of best patterns has been selected:

$$\text{Sorting}(I_{Measurement}(P_N) \in \{I_{min}(P_{N_{min}}) \cdots I_{max}(P_{N_{max}})\}) \Rightarrow \qquad (7)$$

$$\text{Parent}(I_{Measurement}(P_N))N \in \{N_{min} = N_{max} - (N_{max} \times B)N_{max}\}$$

wherein B is the pre-defined percentage of the best pattern group. The sorting function first re-arranges the test patterns from minimum to maximum according to their fitness values. Subsequently, the parent selection is generated in random sequence based on the new sub-optimal fitness range N, which is calculated using B. Parents (selected patterns) are combined using cross over (8), re-combined (9) and mutated (10) in order to produce offspring:

$$\text{CrossOver}(P_N(C_1, C_2), P_{N+1}(C_3, C_4)) \Rightarrow \text{Upper\_CrossOver}(P_N(C_3, C_2), P_{N+1}(C_1, C_4)) \qquad (8)$$

$$\Rightarrow \text{Lower\_CrossOver}(P_N(C_1, C_4), P_{N+1}(C_3, C_2))$$

$$\Rightarrow \text{Stripe\_CrossOver}(P_N(C_4, C_3), P_{N+1}(C_2, C_1))$$

where C is the test pattern content which is selected for cross over of two patterns. In the cross over process, upper, lower or stripe cross over methods are performed in random sequence, and the contents of two cross over patterns are exchanged in order to produce two new offspring patterns. Thereafter, the re-combination equation (9) is used to select the best fitness pattern out of two new cross over offspring patterns:

$$\text{Recombination}(P_N, P_{N+1}) \rightarrow I_{maximum}(P_N, P_{N+1}) \rightarrow I_{Best}(P_M), N, M, \quad P_N > 0 \qquad (9)$$

$$\text{Mutation } (P_M(C_1, C_2, C_3, C_4 \ldots C_y)) \Rightarrow P_M(C_1 + R_1, C_2 + R_2, \ldots C_y + R_y) \qquad (10)$$

$$R_y \in \{1 \ 0 \ -1\}, M, P_M, y > 0$$

where M is the number of new selected offspring patterns to form the new population. After recombination, the offspring undergoes mutation. Offspring variables are mutated by the addition of small random values $$\text{Ry} \in \{1 \ 0 \ -1\}. \qquad (11)$$

The mutation process helps to improve the optimization search process.

Finally, all offspring patterns are inserted into the population, replacing the parents (original pattern population) and producing a new generation. This cycle (loop 1 in FIG. 1) is performed until the optimization criteria are met.

If the fitness does not improve after a pre-defined number of genetic breeding generations, a new pattern population (loop 2 in FIG. 1) will be generated in random sequence. This combination greatly increases the chances of finding worst case test patterns.

A complete implementation of this algorithm using ATE J973 is given in the annex.

Figure 2:
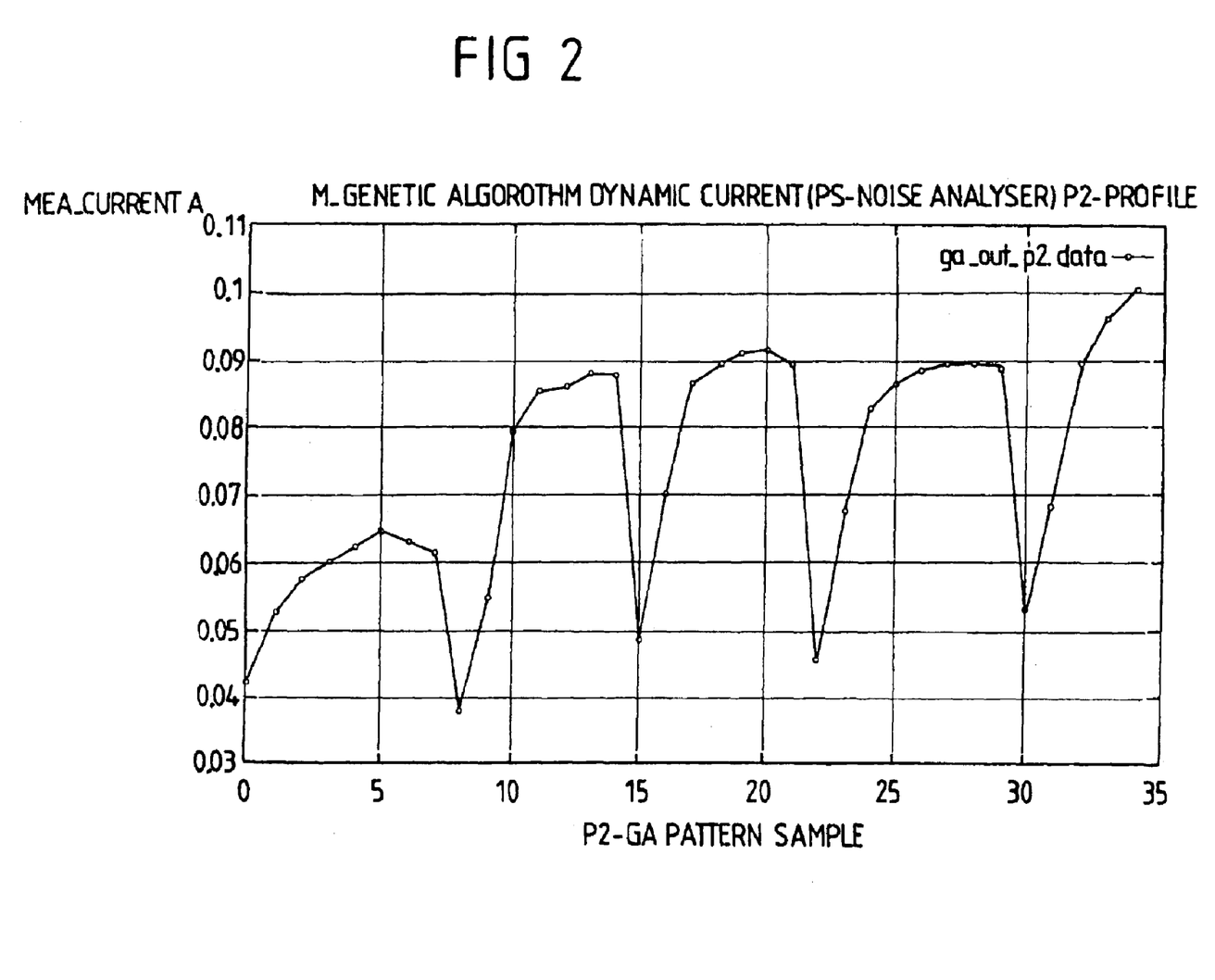
FIG. 2 is a graph illustrating the results of a practical experiment using a method according to an embodiment of the invention.

FIG. 2 illustrates an experimental plot of a dynamic genetic algorithm approach (100 MHz, VDDP IO Pad eDRAM core). The experiment included 20 patterns in each population and 34 (population) genetic algorithm search samples (loop 2+loop 1). The total number of patterns processed was 20*34=680. The experiment lasted considerably shorter than a simulation-based approach, and the current bound obtained through using the worst case pattern was higher compared to conventional dynamic random algorithm-based approaches.

Another embodiment of the invention will now be described with reference to FIG. 3.

As indicated above, the maximum switching noise occurring during operation of an integrated circuit is directly related to the steepest maximum switching dynamic current spike. The switching behavior depends on the test patterns applied to the circuit.

In addition, the switching noise depends on the deviation of input signals (AC & DC conditions/parameters) applied to the integrated circuit. This reflects operation of integrated circuits in practice, where a 10% power supply fluctuation can occur in most applications.

Accordingly, signal switching and deviation can have a great impact on internal signal behavior (e.g. propagation delay) and switching noise. However, using the simulation-based approach, it is not possible to simulate millions of test patterns and different input signal conditions at the same time. Therefore, simulation-based approaches take into account signal switching only and ignore the other important cause of switching noise, namely signal deviation.

Figure 3:
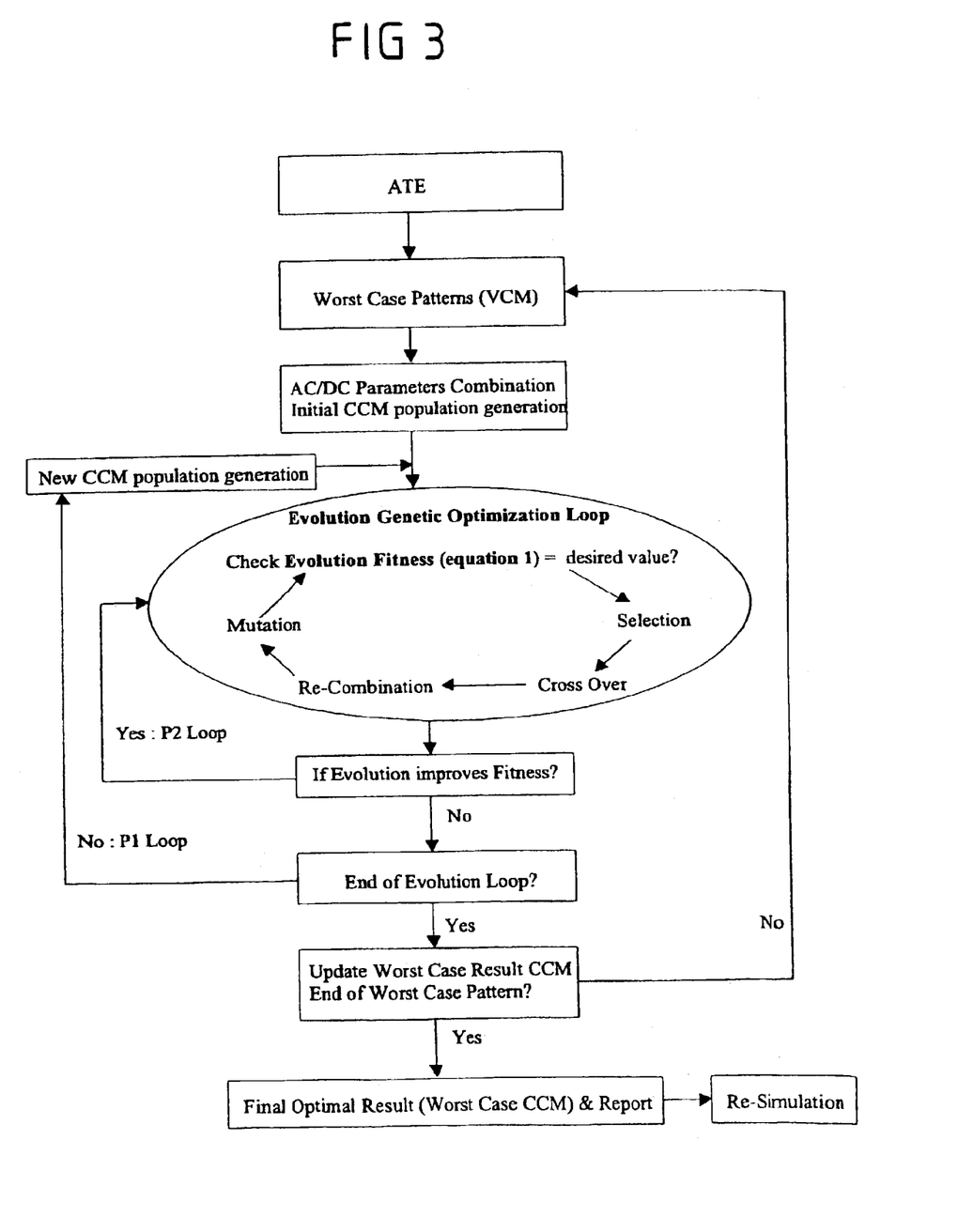
FIG. 3 is a flow chart illustrating a method according to another embodiment of the invention.

According to the embodiment of FIG. 3, a method is provided that allows for signal switching and signal deviation analysis at the same time. This results in a more efficient analysis of the operational behavior of an integrated circuit than known methods.

Worst case conditions of operation of an integrated circuit depends the level of switching noise. The switching noise is mainly influenced by signal switching events (different test patterns) and signal deviation (AC/DC parameter variation). In order to approximate a worst case condition, the steepest maximum switching dynamic current is to be detected. The switching dynamic current is a function of the test pattern (signal switching) and test condition variation (signal deviation). This can be subject to the constraint that the test patterns have to be valid. Alternatively, the approximation can be implemented without constraint such that the dynamic current function explores the fail region without any input signal deviation limits (e.g. +/−12.5%).

An implementation of an approximation of worst case signal switching and deviation using a constraint optimization approach is illustrated in FIG. 3. Initially, a number of individual worst case random patterns $P_N^{PPOP}=(p_1, p_2, \ldots, p_N)$ are generated using the above described method, wherein N is the maximum number of worst case patterns and PPOP is the worst case pre-selected pattern population.

Subsequently, a number of AC or DC parameters $S_M^{SPOP}$ $(AC|DC)=(S_1, S_2, \ldots, S_M)$ are pre-selected, wherein M is the maximum number of worst case conditions and SPOP is a pre-selected worst case condition population. Every single condition population contains a number of pre-selected AC or DC parameters. Multiple populations form a condition code matrix (CCM) file.

Similarly, worst case patterns are stored in a vector code matrix (VCM).

The function for approximating the highest switching noise is defined as a dynamic current function in respect of the switching pattern populations and the condition parameter populations subject to the constraint that the test patterns have to be valid. Thus, the signal switching and deviation analysis is always inside the valid range. It may be useful, however, to detect the boundaries of the valid range.

The power supply switching and deviation noise estimation problem can be formulated as follows:

Maximize($I_{switching/deviation\_noise}(P_N^{PPOP}, S_M^{SPOP}(AC|DC))), \forall N, M, PPOP, SPOP > 0$ Subject to the constraint:Pattern_Pass($P_N^{PPOP}$)

$(AC|DC) \in \{X_{AC\_SPEC} X_{DC\_SPEC}\}_{deviation}$, $0 \leq \text{deviation} \leq 100$ (12)

As indicated above, evolutionary genetic methods are stochastic optimization concepts that mimic biological evolution. Such genetic concept can be employed to detect worst case switching patterns, as described above. The algorithm detects the best fit to the problem by evolution, i.e. processing series of test patterns in parallel. The test patterns are contained in test pattern populations. The fitness is defined as dynamic current in respect of each trial test pattern (signal switching).

Equation (12) reflects test pattern and test condition deviation. In order to produce valid results from input signal deviation with respect to the test patterns, the function must be subjected to the constraint that the test patterns must be valid, since signal fluctuation could otherwise cause test pattern failure.

The fitness in this embodiment is associated with the steepest maximum switching dynamic current, subject to the above mentioned constraint.

Referring more specifically to FIG. 3, initially, a number of pre-selected individual test condition combinations (the population/CCM) with respect to a set of worst case patterns (VCM) are randomly generated and initialized. Equation (12) is then evaluated in respect of "fitness" for each combination using ATE, and the averaged fitness of the initial population is calculated.

If the optimization criteria is not met (see "check evolution fitness" in FIG. 3), the creation of a new population is initiated. Individual test condition combinations are selected according to their fitness for the production of offspring (Evolution Genetic Optimization Loop). In the selection approach, the basic concept of tournament selection is employed, i.e. only the best individual combination from this population is selected as parents.

This process is repeated until a pre-defined percentage of best combinations has been selected. The sorting function first re-arranges the test condition combination according to their fitness values from minimum to maximum. Subsequently, the parents are selected in random sequence based on the new sub-optimal fitness range. Parents (selected test condition combinations) are subjected to cross-over, recombination and/or mutation to produce offspring.

In the cross-over process, a method of binary cross-over is used in random sequence, and the contents of two cross-over test condition combinations are exchanged accordingly to produce new offspring combinations. Subsequently, the re-combination process is used to select the best fitness combination out of two new cross-over offspring combinations.

After re-combination, the offspring undergoes mutation. That is, the offspring variables are mutated by the addition of small random values. The mutation rate ranges from −1 to 1. The mutation process helps to improve the optimization search process.

Finally, all offspring are inserted into the population and thus replace the parents (original CCM population), producing a new population.

This cycle is performed until the optimization criteria are met or the end of the optimization loop is reached. If the fitness has not improved after a pre-defined number of genetic breeding generations, a new population is generated in random sequence.

At the end of the evolution loop as shown in FIG. 3, the worst case fitness is detected automatically from all processed populations. The CCM database is updated accordingly.

The whole process is repeated until all worst case patterns from the VCM file have been processed. The final worst case CCM is then generated automatically.

The above described evolution method greatly improves the chances of finding the worst case signal deviation and signal switching combination. At the same time, it is faster and more efficient than known random- or trial-based approaches.

It is to be noted that the invention is not restricted to the embodiments and implementations described herein but encompasses modifications and variations within the scope of the invention as determined from the claims.

---

Annex: Dynamic Genetic Algorithm (D_GA) Implementation Using J973 ATE
Start D_GA: Circuit Initialization
Default AC/DC Specification Initialization.
DP Dummy Pattern: Vector Memory Initialization
INPUT: {N Vector_Cycles DP Loop1 Loop2 $I_{Max\_REF}$}
Check if Input valid?
Else Input Error! Exit(1).
For POP=0, 1, 2, 3, . . . , Loop2+1 do:
{

$$\text{Random\_Pattern\_Generation} \Rightarrow P \in (p_1, p_2, \ldots, p_N)$$
$$\forall \text{ vector\_cycle}, N > 0$$
$$P_N^{POP} = (p_1, p_2, \ldots, p_N) \text{InitialPatternPopulation}$$

For P1=0,1,2,3, . . . , N+1 do:
{

$$\text{Vector\_Code\_Matrix}(P_N(\text{Vector\_Cycles})) \Rightarrow \begin{bmatrix} P_0(\text{Vector\_Cycles}) \\ P_1(\text{Vector\_Cycles}) \\ \vdots \\ P_N(\text{Vector\_Cycles}) \end{bmatrix}$$

$P_N(\text{Vector\_Cycles}) \in P_N(\text{vector\_encode}(\forall \text{signal\_bus}), \text{Vector\_Cycles}))$
Pattern_Generator(Vector_Memory($P_N$))

$\Rightarrow$ Pattern_Controller(Vector_Memory($P_N$))N > 0(PatternExecutor)

Start Pattern Generator: $P_N(T_{min}, T_{max}) \Rightarrow$ Dynamic_Pattern

Start Current Measurement & Calculation:

$$I_{Measurement}(P_N, T) = \frac{V_{DD}(P_N, T)}{R_{eff}} + \frac{1}{L_{eff}} \int_{T_{min}}^{T_{max}} V_{DD}(P_N, T) dT + \Delta I_{CMOS}(P_N, T) \forall T, P_N > 0$$

$T = SRMS(T_{min}, T_{max}) \Rightarrow$ Random_Float_Number($T_{min}, T_{max}$)
$T_{max} \geq T_{min}, \forall T_{min}, T_{max} > 0$ Stop Pattern Generator: $P_N : I_{peak}(\forall I_{sample}(P_N, SRMS)), I_{averaged}(P_N, SRMS)$
$\text{Fixness}(P_N) = I_{Measurement}(P_N, T) \in \{I_{peak} I_{averaged}\}$
}

$$\text{Averaged\_Fixness}(\text{Fixness}(P_N^{POP})) = \frac{\sum_{N=0}^{N} I_{Measurement}(P_N)}{N}, N, P_N > 0$$

if    (Averaged_Fixness($I_{Measurement}(P_N^{POP})) > I_{Max\_REF}$)
        {Final VCM Generation(Database1) exit(1)}
For P2=0,1,2,3, . . . , Loop1+1 do:
{

Sorting($I_{Measurement}(P_N) \in \{I_{min}(P_{N_{min}}) \ldots I_{max}(P_{N_{max}})\}) \Rightarrow$ Parent($I_{Measurement}(P_N)$)
N              $\in \{N_{min} N_{max}\}$                    $N \in \{N_{min} = N_{max} - (N_{max} \times B)N_{max}\}$ -continued $$\text{CrossOver}(P_N(C_1, C_2), P_{N+1}(C_3, C_4)) \Rightarrow \text{Upper\_CrossOver}(P_N(C_3, C_2), P_{N+1}(C_1, C_4))$$
$$\Rightarrow \text{Lower\_CrossOver}(P_N(C_1, C_4), P_{N+1}(C_3, C_2))$$
$$\Rightarrow \text{Stripe\_CrossOver}(P_N(C_4, C_3), P_{N+1}(C_2, C_1))$$

$$\text{Recombination}(P_N, P_{N+1}) \Rightarrow I_{maximum}(P_N, P_{N+1}) \Rightarrow I_{Best}(P_M), N, M, P_N > 0$$
$$\text{Mutation}(P_M(C_1, C_2, C_3, C_4 \ldots C_y)) \Rightarrow P_M(C_1 + R_1, R_2 + R_2, \ldots C_y + R_y)$$
$$R_y \in \{1\ 0\ -1\}, M, P_M, y > 0$$

For P3=0,1,2,3, ..., M+1 do:
{
Pattern_Generator(Vector_Memory($P_M$))
$\Rightarrow$ Pattern_Controller(Vector_Memory($P_M$))M > 0(Pattern Executor)

Start Pattern Generator: $P_M(T_{min}, T_{max}) \Rightarrow$ Dynamic_Pattern

Start Current Measurement & Calculation:

$$I_{Measurement}(P_M, T) = \frac{V_{DD}(P_M, T)}{R_{eff}} + \frac{1}{L_{eff}} \int_{T_{min}}^{T_{max}} V_{DD}(P_M, T) dT + \Delta I_{CMOS}(P_M, T) \forall T, P_M > 0$$

$$T = SRMS(T_{min}, T_{max}) \Rightarrow \text{Random\_Float\_Number}(T_{min}, T_{max})$$
$$T_{max} \geq T_{min}, \forall T_{min}, T_{max} > 0$$

Stop Pattern Generator: $P_M : I_{peak}(\forall I_{sample}(P_M, SRMS)), I_{averaged}(P_M, SRMS)$
$$\text{Fixness}(P_M) = I_{Measurement}(P_M, T) \in \{I_{peak} I_{averaged}\}$$

}

$$\text{Averaged\_Fixness}(\text{Fixness}(P_M^{POP})) = \frac{\sum_{M=0}^{M} I_{Measurement}(P_M)}{M}, M, P_M > 0$$

(Averaged_Fixness($I_{Measurement}(P_M^{POP})$) > $I_{Max\_REF}$)
{Worst Case Pattern Found : Final VCM Generation (Database1) exit(1)}
} End of Loop 1
} End of Loop 2
Update So Far Worst Case Pattern Found: Final VCM Generation (Database 1)
End of D_GA

---

I claim:

1. A method of generating a set of test patterns, the method which comprises the steps of:
   (a) generating a set of test patterns on a random basis for one of stimulating and testing a layout of an integrated circuit;
   (b) applying the set of test patterns to the integrated circuit by using an automatic test equipment;
   (c) determining outputs of the integrated circuit;
   (d) processing the outputs in order to determine whether given test criteria are met; and
   (e) depending on a determination result in step (d), generating a new set of test patterns based on the set of test patterns generated in step (a) by using a genetic algorithm.

2. The method according to claim 1, which comprises repeating steps (b) to (e) until the given test criteria are met.

3. The method according to claim 1, which comprises:
   (f) repeating steps (b) to (e) until a condition is met, the condition being selected from the group consisting of meeting the given test criteria and repeating steps (b) to (e) a given number of times.

4. The method according to claim 3, which comprises:
   generating a new set of test patterns on a random basis, if the given test criteria are not met after repeating steps (b) to (e) the given number of times; and
   repeating step (f) based on the new set of test patterns.

5. The method according to claim 1, which comprises concluding that the given test criteria are met if the set of test patterns is associated with an average fitness above a given value.

6. The method according to claim 2, wherein step (e) includes combining at least some of the test patterns according to the genetic algorithm in order to generate the new set of test patterns.

7. The method according to claim 6, which comprises:
   selecting test patterns from the set of test patterns according to given selection criteria in order to provide selected test patterns; and
   combining the selected test patterns according to the genetic algorithm in order to generate the new set of test patterns.

8. The method according to claim 7, which comprises selecting a test pattern if the test pattern is associated with a fitness value greater than a reference value.

9. The method according to claim 7, which comprises:
(g) selecting a test pattern if the test pattern is associated with a highest fitness value of all unselected test patterns.

10. The method according to claim 9, which comprises repeating step (g) until a given percentage of test patterns has been selected.

11. The method according to claim 9, wherein step (e) includes:
(h) sorting the selected test patterns according to an order of associated fitness values;
(i) randomly selecting parent test patterns from test patterns as sorted in step (h) in order to provide selected parent test patterns; and
(j) combining the selected parent test patterns.

12. The method according to claim 1, which comprises using, as the genetic algorithm, an algorithm having at least one element selected from the group consisting of a crossing over, a re-combination, and a mutation of selected ones of the test patterns.

13. The method according to claim 1, wherein step (a) includes generating a plurality of sets of test patterns, each set of test patterns being included in a test pattern population.

14. The method according to claim 13, which comprises performing steps (a) to (e) for each respective test pattern population.

15. A method of generating a set of input signals, the method which comprises the steps of:
(m) generating a plurality of sets of input signals for one of simulating and testing a layout of an integrated circuit;
(n) applying the plurality of sets of input signals to the integrated circuit by using an automatic test equipment;
(o) determining outputs of the integrated circuit;
(p) processing the outputs in order to determine whether given test criteria are met; and
(q) depending on a determination result in step (p), generating a new plurality of sets of input signals based on the plurality of sets of input signals generated in step (m) by using a genetic algorithm.

16. The method according to claim 15, which comprises generating the plurality of sets of input signals such that at least some of the input signals are associated with a number of AC/DC parameters.

17. The method according to claim 15, which comprises providing respective given parameters of each respective one of the sets of input signals such that given parameters of each one of the sets of input signals varies from given parameters of each other one of the sets of input signals.

18. The method according to claim 15, which comprises repeating steps (n) to (q) until the given test criteria are met.

19. The method according to claim 15, which comprises:
(r) repeating steps (n) to (q) until a condition is met, the condition being selected from the group consisting of meeting the given test criteria and repeating steps (n) to (q) a given number of times.

20. The method according to claim 15, which comprises concluding that the given test criteria are met if the plurality of sets of input signals is associated with a worst case of operation situation.

21. The method according to claim 15, wherein step (q) includes combining at least some of corresponding ones of the input signals of different sets of input signals according to the genetic algorithm in order to generate a new set of input signals.

22. A method of generating test patterns and input signals, the method which comprises the steps of:
generating a set of test patterns on a random basis for one of simulating and testing a layout of an integrated circuit, applying the set of test patterns to the integrated circuit by using an automatic test equipment and processing outputs of the integrated circuit in order to determine whether given test criteria are met, and, depending on a determination result, generating a new set of test patterns based on the set of test patterns by using a genetic algorithm; and
generating a plurality of sets of input signals for one of simulating and testing a layout of the integrated circuit, applying the plurality of sets of input signals to the integrated circuit by using the automatic test equipment and processing outputs of the integrated circuit in order to determine whether given test criteria are met, and, depending on a determination result, generating a new plurality of sets of input signals based on the plurality of sets of input signals by using a genetic algorithm.

23. A data processing configuration, comprising:
an automatic test equipment; and
a data processing system operatively connected to said automatic test equipment, said data processing system being programmed to generate a set of test patterns on a random basis, apply the set of test patterns to an integrated circuit by using said automatic test equipment, determine outputs of the integrated circuit, process the outputs in order to determine whether given test criteria are met, and depending on a determination result, generate a new set of test patterns based on the set of test patterns by using a genetic algorithm.

24. A data processing configuration, comprising:
an automatic test equipment; and
a data processing system operatively connected to said automatic test equipment, said data processing system being programmed to generate a plurality of sets of input signals, apply the plurality of sets of input signals to an integrated circuit by using said automatic test equipment, determine outputs of the integrated circuit, process the outputs in order to determine whether given test criteria are met, and depending on a determination result, generate a new plurality of sets of input signals based on the plurality of sets of input signals by using a genetic algorithm.

25. A computer-readable medium having computer-executable instructions for performing a method of generating a set of test patterns, the method which comprises the steps of:
(a) generating a set of test patterns on a random basis for one of simulating and testing a layout of an integrated circuit;
(b) applying the set of test patterns to the integrated circuit by using an automatic test equipment;
(c) determining outputs of the integrated circuit;
(d) processing the outputs in order to determine whether given test criteria are met; and
(e) depending on a determination result in step (d), generating a new set of test patterns based on the set of test patterns generated in step (a) by using a genetic algorithm.

26. A computer-readable medium having computer-executable instructions for performing a method of generating a set of input signals, the method which comprises the steps of:

(m) generating a plurality of sets of input signals for one of simulating and testing a layout of an integrated circuit;

(n) applying the plurality of sets of input signals to the integrated circuit by using an automatic test equipment;

(o) determining outputs of the integrated circuit;

(p) processing the outputs in order to determine whether given test criteria are met; and (q) depending on a determination result in step (p), generating a new plurality of sets of input signals based on the plurality of sets of input signals generated in step (m) by using a genetic algorithm.

* * * * *

UNITED STATES PATENT AND TRADEMARK OFFICE
CERTIFICATE OF CORRECTION

PATENT NO. : 6,993,735 B2
APPLICATION NO. : 10/623067
DATED : January 31, 2006
INVENTOR(S) : Chee Hong Eric Liau Page 1 of 1

It is certified that error appears in the above-identified patent and that said Letters Patent is hereby corrected as shown below:

On the Title Page
Item [75] should read as follows:

Chee Hong Eric Liau, München (D)

Signed and Sealed this

Twentieth Day of November, 2007

JON W. DUDAS
*Director of the United States Patent and Trademark Office*